(12) United States Patent
Ishii

(10) Patent No.: US 10,937,865 B2
(45) Date of Patent: Mar. 2, 2021

(54) SEMICONDUCTOR DEVICE HAVING TRANSISTORS IN WHICH SOURCE/DRAIN REGIONS ARE SHARED

(71) Applicant: MICRON TECHNOLOGY, INC., Boise, ID (US)

(72) Inventor: Toshinao Ishii, Machida (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/514,828

(22) Filed: Jul. 17, 2019

(65) Prior Publication Data

US 2021/0020746 A1 Jan. 21, 2021

(51) Int. Cl.
*G11C 11/00* (2006.01)
*H01L 29/08* (2006.01)
*G11C 11/412* (2006.01)
*H01L 29/06* (2006.01)
*H01L 29/423* (2006.01)
*H01L 29/10* (2006.01)
*G11C 11/413* (2006.01)

(52) U.S. Cl.
CPC ........ *H01L 29/0847* (2013.01); *G11C 11/412* (2013.01); *G11C 11/413* (2013.01); *H01L 29/0619* (2013.01); *H01L 29/1083* (2013.01); *H01L 29/4238* (2013.01)

(58) Field of Classification Search
CPC ............ H01L 29/0847; H01L 29/0619; H01L 29/1083; H01L 29/4238; G11C 11/412; G11C 11/413
See application file for complete search history.

(56) References Cited

U.S. PATENT DOCUMENTS

| 9,780,099 B1 * | 10/2017 | Yeh | H01L 27/0207 |
| 2009/0067220 A1 * | 3/2009 | Asayama | G11C 11/412 365/154 |
| 2020/0105768 A1 * | 4/2020 | Liaw | G11C 7/18 |

* cited by examiner

*Primary Examiner* — Uyen Smet
(74) *Attorney, Agent, or Firm* — Dorsey & Whitney LLP

(57) ABSTRACT

Disclosed herein is an apparatus that includes: a first diffusion region having a rectangular shape and including first and second source/drain regions arranged in the first direction; a second diffusion region having a rectangular shape and including third to fifth source/drain regions arranged in the first direction; a first gate electrode extending in a second direction, and provided between the first and second source/drain regions and between the third and fourth source/drain regions; and a second gate electrode extending in the second direction, and provided between the fourth and fifth source/drain regions. The first and third source/drain regions are brought into the same potential as each other, and the second and fourth, source/drain regions are brought into the same potential as each other.

14 Claims, 6 Drawing Sheets

SEMICONDUCTOR DEVICE HAVING TRANSISTORS IN WHICH SOURCE/DRAIN REGIONS ARE SHARED

BACKGROUND

In order to further reduce the chip size of a semiconductor device, a is important to contrive the layout of transistors as well as to shrink the process. For example, when one of source/drain regions of a transistor and one of source/drain regions of another transistor have a same potential, these source/drain regions can be shared to reduce an occupied area on the chip, When the source/drain regions are shared between transistors having different gate widths, the planar shape of the diffusion regions becomes, for example, L-shaped. However, diffusion regions having a non-rectangular planar shape exhibit different characteristics from those of diffusion regions having a rectangular planar shape. Therefore, a layout in which the source/drain regions are not shared is employed to prevent the planar shape of the diffusion regions from, for example, becoming an L shape, in this case, the area reduction effect due to sharing of the source/drain regions is not obtained.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
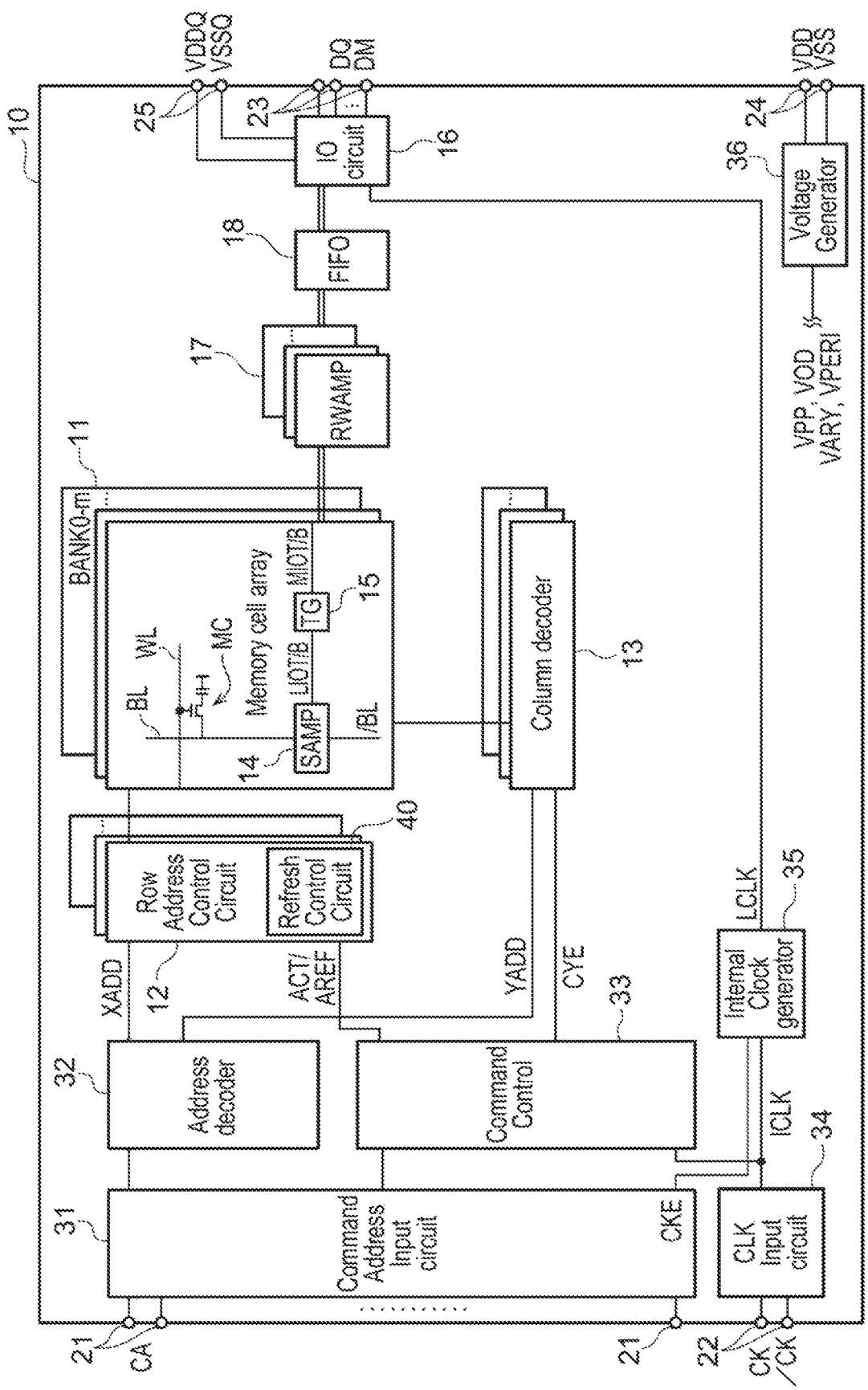
FIG. 1 is a block diagram of a semiconductor device according to an embodiment of the present disclosure.

FIG. 1 is a block diagram of a semiconductor device 10 according to an embodiment of the present disclosure. The semiconductor device 10 may be a LPDDR4 SDRAM incorporated in a single semiconductor chip, for example. The semiconductor device 10 may be mounted on an external substrate, for example, a memory substrate or a mother board. As shown in FIG 1, the semiconductor device 10 includes a memory cell array 11. The memory cell array 11 includes a plurality of word lines WL, a plurality of bit lines BL, and a plurality of memory cells MC arranged at intersections of the word lines WL and the bit lines BL. Selection of a word line WL is performed by a row address control circuit 12, and selection of a bit line BL is performed by a column decoder 13. A sense amplifier 14 is connected to a corresponding bit line BL and a pair of local I/O lines LIOT/B. The pair of local I/O lines LIOT/B is connected to a pair of main I/O lines MIOT/B via a transfer gate 15 functioning as a switch. The memory cell array 11 is divided into (m+1) memory banks including memory banks BANK0 to BANKm.

A plurality of external terminals included in the semiconductor device 10 include command address terminals 21, clock terminals 22, data terminals 23, and power-supply terminals 24 and 25. The data terminals 23 are connected to an I/O circuit 16.

A command address signal CA is supplied to the command address terminals 21. One of the command address signals CA supplied to the command address terminals 21, which relates to an address, is transferred to an address decoder 32 via a command address input circuit 31. Another one that relates to a command is transferred to a command control circuit 33 via the command address input circuit 31. The address decoder 32 decodes an address signal and generates a row address XADD and a column address YADD. The row address XADD is supplied to the row address control circuit 12, and the column address YADD is supplied to the column decoder 13. Further, a command address signal CA that functions as a clock enable signal CKE is supplied to an internal clock generator 35.

Complementary external clock signals CK and /CK are supplied to the clock terminals 22. The complementary external clock signals CK and /CK are input to a clock input circuit 34. The clock input circuit 34 generates an internal clock signal ICLK based on the complementary external clock signals CK and /CK. The internal clock signal ICLK is supplied to at least the command control circuit 33 and the internal clock generator 35. The internal clock generator 35 is activated by the clock enable signal CKE, for example, and generates an internal clock signal LCLK based on the internal clock signal ICLK. The internal clock signal LCLK is supplied to the I/O circuit 16. The internal clock signal LCLK is used as a timing signal that defines a timing at which read data DQ is output from the data terminal 23 at the time of a read operation. in a write operation, write data is input to the data terminal 23 from outside. In the write operation, a data mask signal DM may be input to the data terminal 23 from outside.

Power-supply potentials VDD and VSS are supplied to the power-supply terminals 24. These power-supply potentials VDD and VSS are supplied to a voltage generator 36. The voltage generator 36 generates various internal potentials VPP, VOD, VARY, and VPERI, for example, based on the power-supply potentials VDD and VSS. The internal potential VPP is used mainly in the row address control circuit 12. The internal potentials VOD and VARY are used mainly in the sense amplifier 14 included in the memory cell array 11. The internal potential VPERI is used in many other circuit blocks.

Power-supply potentials VDDQ and VSSQ are supplied to the I/O circuit 16 from the power-supply terminals 25. Although the power-supply potentials VDDQ and VSSQ may be the same potentials as the power-supply potentials VDD and VSS supplied to the power supply terminals 24, respectively, the dedicated power-supply potentials VDDQ and VSSQ are assigned to the I/O circuit 16 in order to prevent propagation of power-supply noise generated in the I/O circuit 16 to another circuit block.

The command control circuit 33 activates an active signal ACT when an active command is issued, and activates a refresh signal AREF when a refresh command is issued. The active signal ACT and the refresh signal AREF are both supplied to the row address control circuit 12. The row address control circuit 12 includes a refresh control circuit 40. The refresh control circuit 40 controls a refresh operation for the memory cell array 11 based on the row address XADD, the active signal ACT, and the refresh signal AREF, The refresh control circuit 40 will be described in detail later.

When a read command is issued from outside, following to the active command, the command control circuit 33 activates a column selection signal CYE. The column selection signal CYE is supplied to the column decoder 11. In response to this signal, read data is read out from the memory cell array 11. The read data read from the memory cell array 11 is transferred to the I/O circuit 16 via a read-write amplifier 17 and an FIFO circuit 18, and is output to outside via the data terminals 23.

Figure 2:
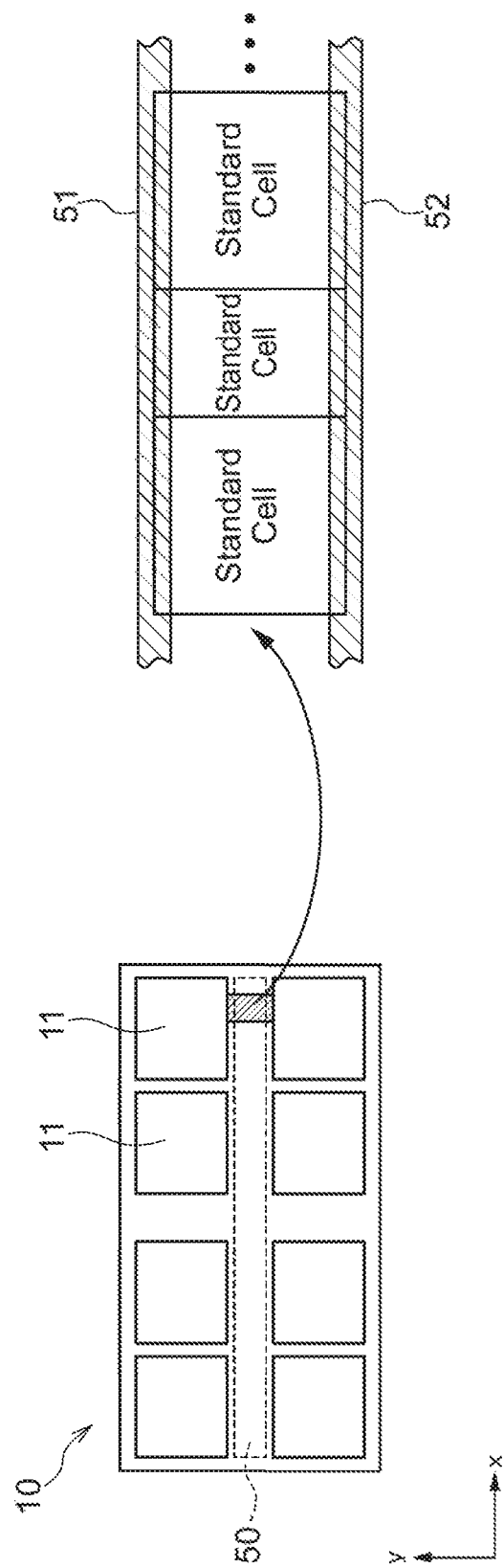
FIG. 2 is a schematic plan view showing an example of a layout of the semiconductor device according to the embodiment of the present disclosure.

FIG. 2 is a schematic plan view showing an example of the layout of the semiconductor device 10. In the example shown in FIG. 2, four memory cell arrays 11 are arranged in an x direction and two memory cell arrays 11 are arranged in a y direction. Peripheral circuits such as the address decoder 32 and the command control circuit 33 are placed in a peripheral circuit region 50 between the four memory cell arrays 11 arranged on one side in the y direction and the four memory cell arrays 11 arranged on the other side in the y direction. Some of the circuits placed in the peripheral circuit region 50 are constituted by a combination of a plurality of standard cells. Standard cells are small-sized logic circuits such as an inverter circuit, a buffer circuit, a NAND gate circuit, a NOR gate circuit, a delay circuit, a latch circuit, and a flip-flop circuit and have a shape in which pattern shapes of transistors and wirings are previously defined. Accordingly, when plural standard cells are combined, a desired circuit can be constituted only with determination of the layout of wirings that connect the standard cells to each other.

A shown in FIG. 2 the standard cells are, for example, arrayed in the x direction in a region between power supply lines 51 and 52 extending in the x direction. Accordingly, the respective heights of the standard cells in the y direction are all constant. Differences in the sizes of the standard cells result from differences in the widths in the x direction. Each of the standard cells operates on a voltage between a power supply potential (VPERI, for example) supplied via the power supply line 51 and a power supply potential (VSS, for example) supplied via the power supply line 52. A plurality of standard cells having a same function and a same layout are formed in the peripheral circuit region 50.

Figure 3A:
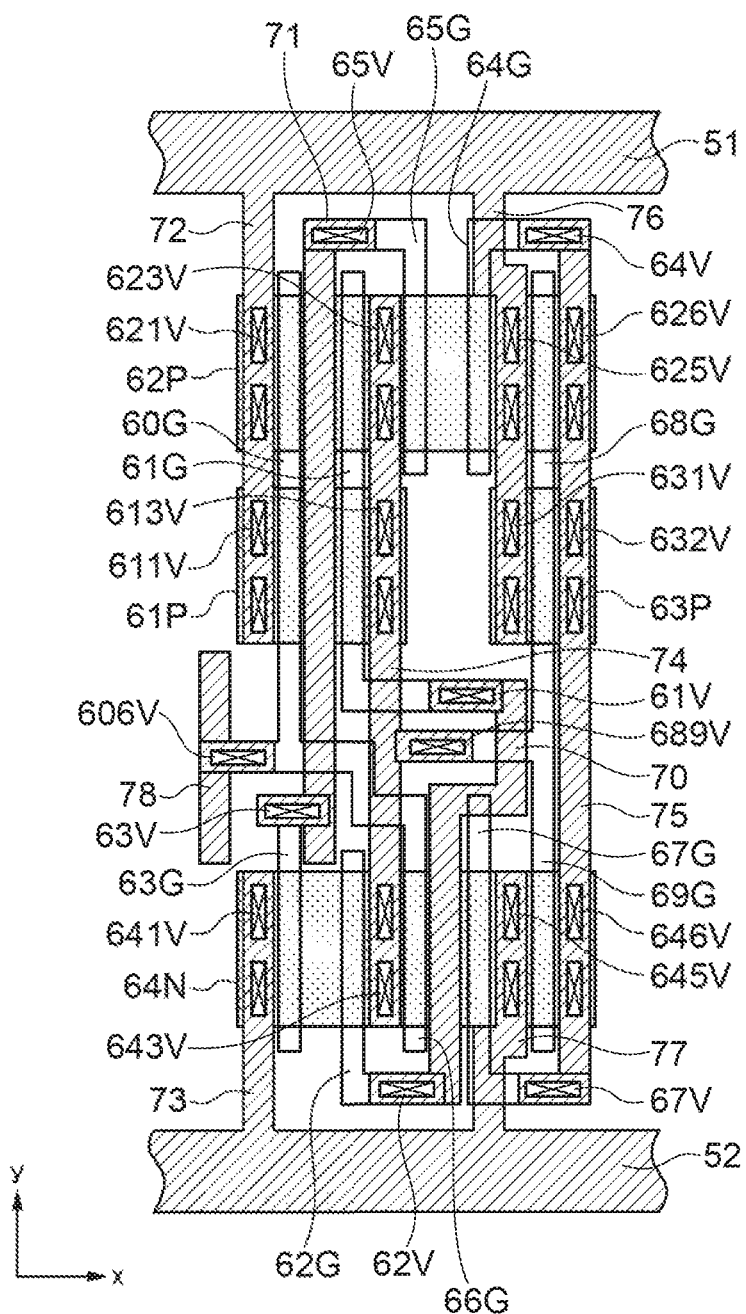
FIG. 3A is a plan view for explaining a layout of a standard cell constituting a latch circuit.
Figure 3B:
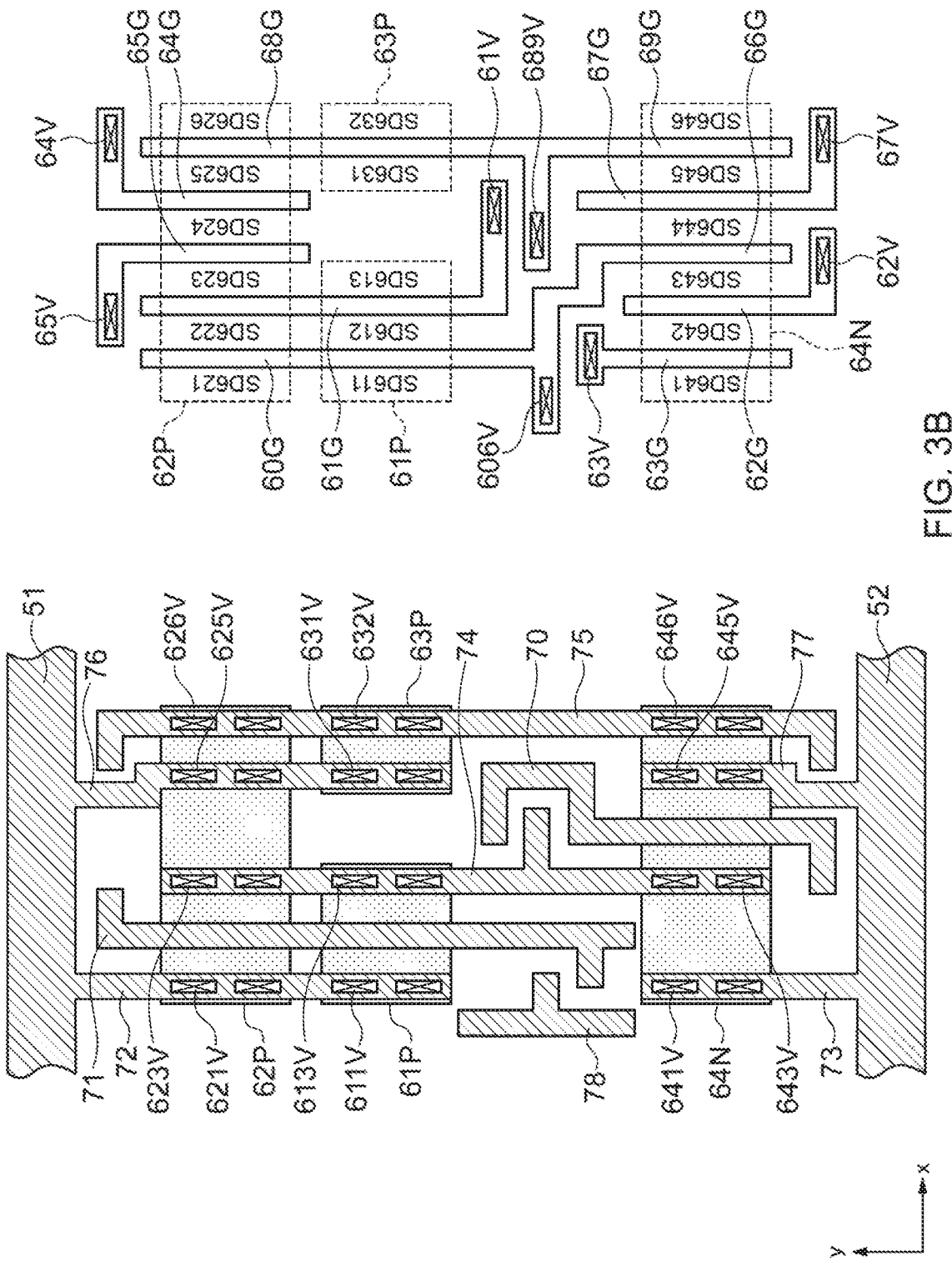
FIG. 3B is a layout chart separately showing gate electrodes and wiring patterns in an upper layer shown in FIG. 3A.

FIG. 3A is a plan view for explaining a layout of a standard cell constituting a latch circuit. FIG. 3B is a layout chart separately showing gate electrodes and wiring patterns in an upper layer shown in FIG. 3A in view of easy understanding of the drawing.

The standard cell shown in FIGS. 3A and 3B includes P-type impurity regions 61P to 63P, an N-type impurity region 64N, and gate electrodes 60G to 69G. The P-type impurity region 61P overlaps with two gate electrodes 60G and 61G extending in the y direction. A region not overlapping with the gate electrodes 60G and 61G in the P-type impurity region 61P forms source/drain regions SD611 to SD613. The P-type impurity region 62P overlaps with five gate electrodes 60G 61G, 65G, 64G and 68G extending in the y direction, A region not overlapping with the gate electrodes 6OG 61G, 65G, 64G and 68G in the P-type impurity region 62P forms source/drain regions SD621 to SD626. The P-type impurity region 63P overlaps with one gate electrode 68G extending in the y direction. A region not overlapping with the gate electrode 68G in the P-type impurity region 63P forms source/drain regions SD631 and SD632. The N-type impurity region 64N overlaps with five gate electrodes 63G, 62G, 66G, 67G, and 69G extending in the y direction. A region not overlapping with the gate electrodes 63G, 62G, 66G, 67G, and 69G in the N-type impurity region 64N forms source/drain regions SD641 to SD646.

For example, the length of the P-type impurity region 62P in the x direction is equal to the length of the N-type impurity region 64N in the x direction. The length of the P-type impurity region 62P in the x direction is larger than the length of each of P-type impurity regions 61P and 63P in the x direction.

The gate electrodes 61G and 62G are connected to a wiring pattern 70 located in the upper layer with via conductors 61V and 62V, respectively. The gate electrodes 63G and 65G are connected to a wiring pattern 71 located in the upper layer with via conductors 63V and 65V, respectively. The gate electrodes 64G and 67G are connected to a wiring pattern 75 located in the upper layer with via conductors 64V and 67V, respectively. The gate electrodes 60G and 66G are short-circuited with each other and the gate electrodes 68G and 69G are short-circuited with each other. The gate electrodes 60G and 66G are connected to a wiring pattern 78 located in the upper layer with a via conductor 606V. The gate electrodes 68G and 69G are connected to a wiring pattern 74 located in the upper layer with a via conductor 689V.

The source/drain regions SD611 and SD621 are connected to a wiring pattern 72 located in the upper layer with via conductors 611V and 621V, respectively. The wiring pattern 72 is connected to the power supply line 51. The source/drain region SD641 is connected to a wiring pattern 73 located in the upper layer with a via conductor 641V. The wiring pattern 73 is connected to the power supply line 52. The source/drain regions SD613, SD623, and SD643 are connected to the wrong pattern 74 located in the upper layer with via conductors 613V, 623V, and 643V, respectively. As described above, the wiring pattern 74 is connected to the gate electrodes 68G and 69G. The source/drain regions SD626, SD632, and SD646 are connected to the wiring pattern 75 located in the upper layer with via conductors 626V, 632V, and 646V, respectively. As described above, the wiring pattern 75 is connected to the gate electrodes 64G and 67G. The source/drain regions SD625 and SD631 are connected to a wiring pattern 76 located in the upper layer with via conductors 625V and 631V, respectively. The wiring pattern 76 is connected to the power supply line 51. The source drain region SD624 is connected to a wiring pattern 77 located in the upper layer with a via conductor 645V. The wiring pattern 77 is connected to the power supply line 52. Meanwhile, no via conductors are allocated to the source/drain regions SD612, SD622, SD624, SD642, and SD644.

Figure 4:
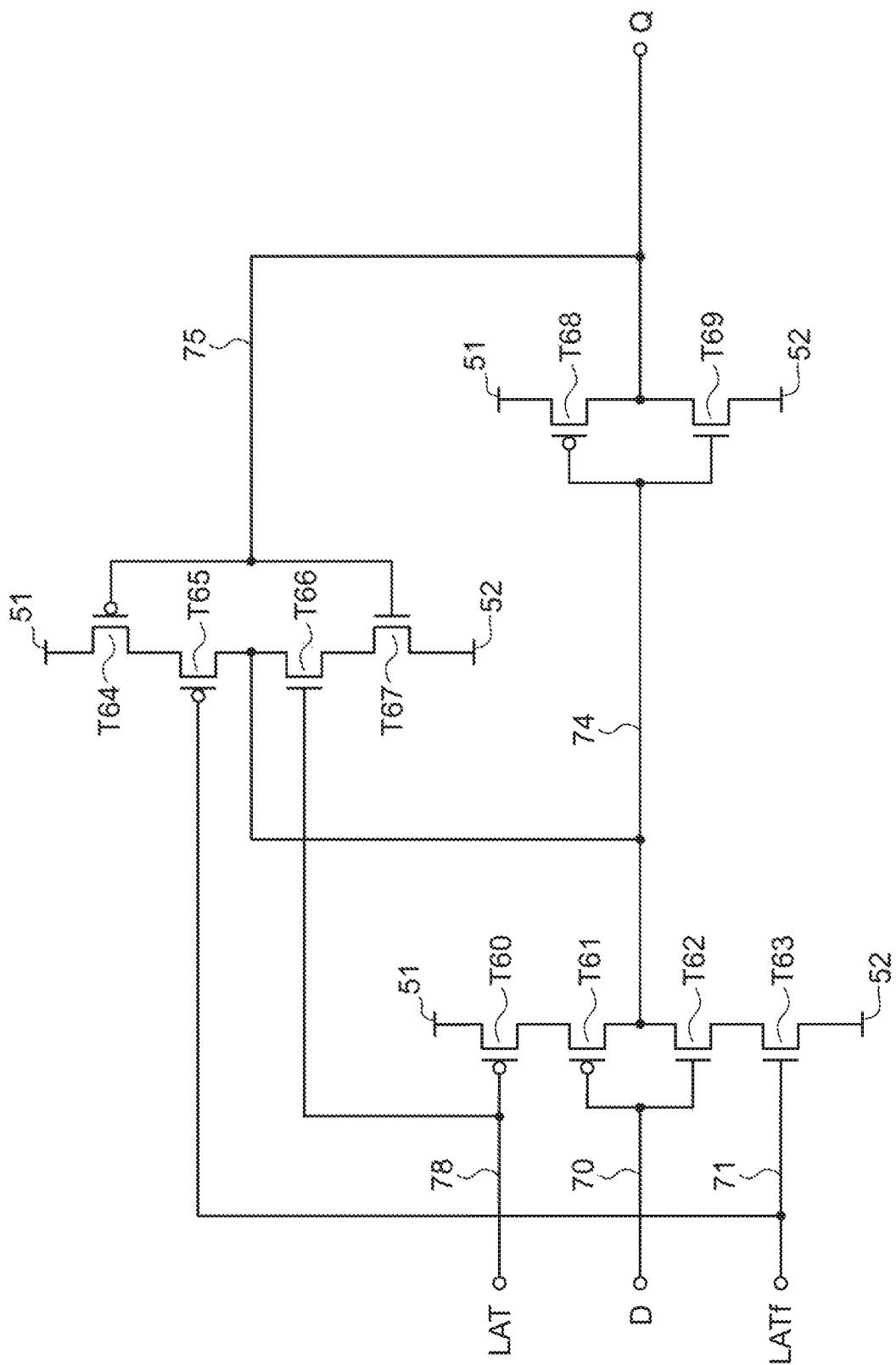
FIG. 4 is a circuit diagram of the standard cell shown in FIGS. 3A and 3B.

FIG. 4 is a circuit diagram of a standard cell shown in FIGS. 3A and 3B. As shown in FIG. 4, the standard cell shown in FIGS. 3A and 3B is constituted by transistors T60 to T69. Among these transistors, the transistors T60, T61, T64, T65, and T68 are P-channel MOS transistors and the transistors T62, T63, T66, T67, and 169 are N-channel MOS transistors. The transistors T60 to T63 are connected in series, the transistors T64 to T67 are connected in series, and the transistors T68 and T69 are connected in series between the power supply line 51 supplied with, for example, the power supply potential VPERI and the power supply line 52 supplied with, for example, the power supply potential VSS.

Gate electrodes of the transistors T61 and T62 are connected in common to the wiring pattern 70 and are supplied with an input signal D via the wiring pattern 70. Gate electrodes of the transistors T60 and T66 are connected in common to the wiring pattern 78 and are supplied with a latch signal LAT via the wiring pattern 78. Gate electrodes of the transistors T63 and T65 are connected in common to the wiring pattern 71 and are supplied with an inverted latch signal LATf via the wiring pattern 71. Drains of the transistors T61 and T62 are connected in common to be connected in common to gate electrodes of the transistors T68 and 169 the wiring pattern 74. Drains of the transistors T68 and T69 are connected in common to be connected in common to gate electrodes of the transistors T64 and T67 via the wiring pattern 75 and to output an output signal Q via the wiring pattern 75. Drains are shared by the transistors T65 and T66 and the transistors T61 and T62, respectively. That is, the source/drain region SD623 is a common drain of the transistors T61 and T65 and the source/drain region SD643 is a common drain of the transistors T62 and T66. Further, sources are shared by the transistors T64 and T68. That is, the source/drain region SD625 is a common source of the transistors T64 and T68.

With this circuit configuration, the input signal D is latched in response to the latch signals LAT and LATf and latched data is output as the output signal Q.

Each of diffusion regions constituting the transistors T60 and T61 is divided into the P-type impurity regions 61P and 62P. That is, a source of the transistor T60 is divided into the source/drain regions SD611 and SD621 and a drain of the transistor T60 is divided into the source/drain regions SD612 and SD622. Potentials of the source/drain regions SD611 and SD621 are same, potentials of the source/drain regions SD612 and SD622 are same, and the common gate, electrode 60G is allocated thereto. Therefore, while the diffusion regions are divided, the transistor T60 essentially functions as one transistor. Similarly, a source of the transistor T61 is divided into the source/drain regions SD612 and SD622 and a drain of the transistor T61 is divided into the source/drain regions SD613 and SD623. Potentials of the source/drain regions SD612 and SD622 are same, potentials of the source/drain regions SD613 and SD623 are same, and the common gate electrode 61G is allocated thereto. Therefore, while the diffusion regions are divided, the transistor T61 essentially functions as one transistor.

Diffusion regions constituting the transistor T68 are divided into the P-type impurity regions 62P and 63P. That is, a source of the transistor T68 is divided into the source/drain regions SD625 and SD631 and a drain of the transistor T68 is divided into the source/drain regions SD626 and SD632. Potentials of the source/drain regions SD625 and SD631 are same, potentials of the source/drain regions SD626 and SD632 are same, and the common gate electrode 68G is allocated thereto. Therefore, while the diffusion regions are divided, the transistor T68 essentially, functions as one transistor.

As described above, because the diffusion regions constituting some transistors are divided in the standard cell shown in FIGS. 3A and 3B, the planar shapes of the diffusion regions can be formed to he rectangular while the source/drain regions are shared by transistors having different gate widths. .For example, because the drain of the transistor T61 and the drain of the transistor T65 have the same potential, one source/drain region can be shared by the drains of these transistors. However, if the source/drain region is shared as it is, the diffusion regions do not form a rectangular shape and form an L shape because the gate width of the transistor T61 is larger than that of the transistor T65. Similarly, because the source of the transistor T64 and the source of the transistor T68 have the same potential, one source/drain region can be shared by the sources of these transistors. However, if the source/drain region is shared as it is, the diffusion regions do not form a rectangular shape and form an L shape because the gate width of the transistor T68 is larger than that of the transistor T64.

Diffusion regions having a non-rectangular planar shape have characteristics different from those of diffusion regions having a rectangular planar shape. In contrast thereto, in the standard cell shown in FIGS. 3A and 3B, the diffusion regions constituting the transistors T61 and T68 are divided into two parts to cause the height in the y direction of one of the divided parts of the diffusion regions to match the height in the y direction of the diffusion regions constituting the transistor T65 or the transistor T64. Therefore, while the drain is shared by the transistor T61 and the transistor T65 and the drain is shared by the transistor T68 and the transistor T64, the planar shape of the diffusion regions can be formed to be rectangular.

In a case where the diffusion regions constituting the transistor T61 are not divided, the transistor T61 and the transistor T65 cannot share the drain and need to use separate source/drain regions to maintain the rectangular shape of the diffusion regions. Accordingly, the size of the standard cell in the x direction is increased. Similarly, in a case where the diffusion regions constituting the transistor T68 are not divided, the transistor T68 and the transistor T64 cannot share the source and need to use separate source/drain regions to maintain the rectangular shape of the diffusion regions. Therefore, the size of the standard cell in the x direction is increased. In the present embodiment, in contrast thereto, the transistor T61 and the transistor T65 share the drain and the transistor T68 and the transistor T64 share the source. Therefore, the effect of reducing the area by 21.6% is obtained as compared to the case where the source/drain regions are not shared.

Figure 5:
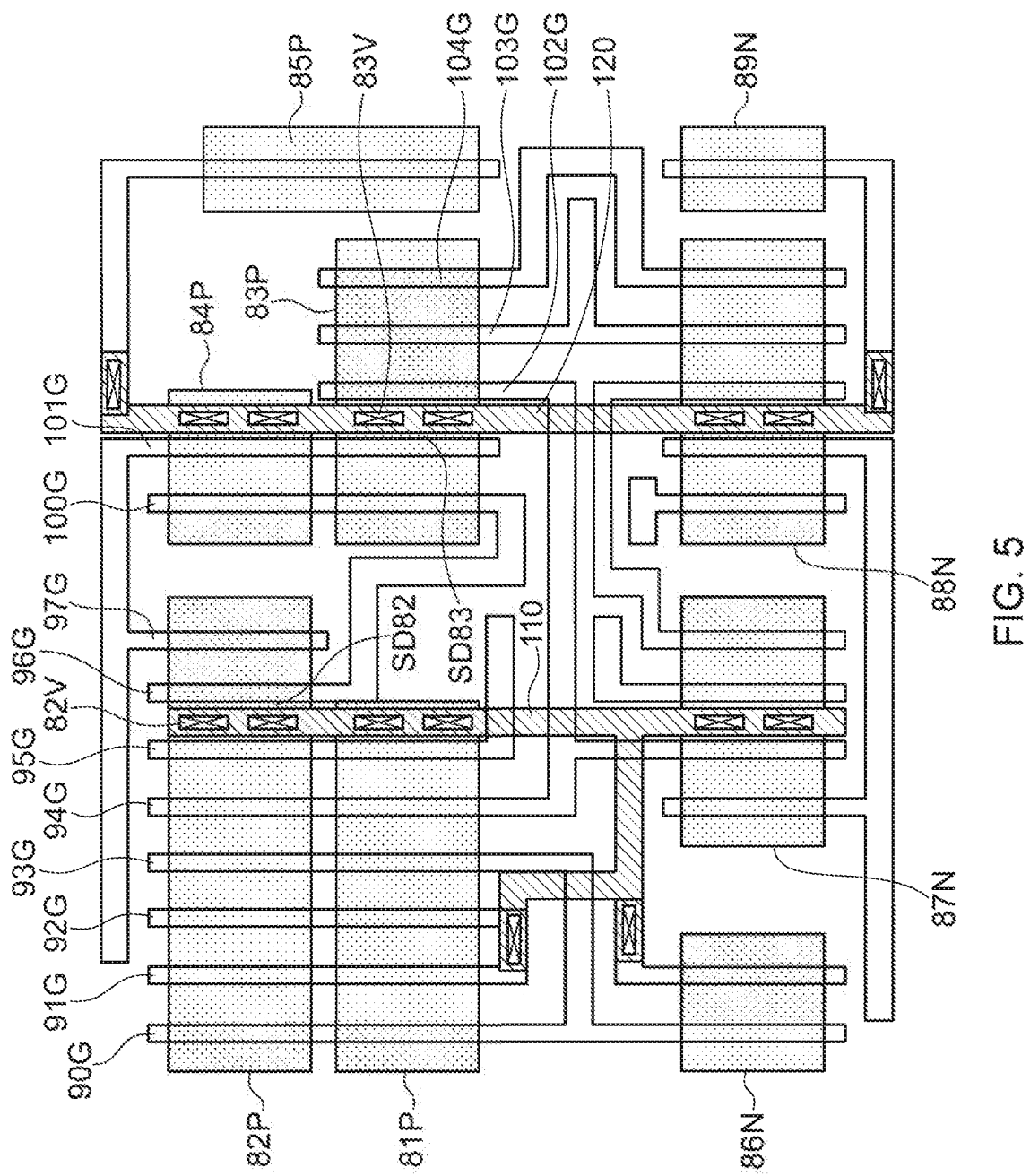
FIG. 5 is a plan view for explaining a layout of a standard cell constituting a flip-flop circuit.

FIG. 5 is a plan view for explaining a layout of a standard cell constituting a flip-flop circuit and shows only diffusion regions, gate electrodes, and some of upper wirings in view of easy understanding of the drawing. The standard cell shown in FIG. 5 includes P-type impurity regions 81P to 85P, N-type impurity regions 86N to 89N, and gate electrodes 90G to 97G and 100G to 105G. The gate electrodes 90G to 95G overlap with both the P-type impurity regions 81P and 82P, and the gate electrodes 96G and 97G overlap with only the P-type impurity region 82P. That is, the gate widths of the gate electrodes 90G to 95G are larger than those of the gate electrodes 96G and 97G. Therefore, if a single P-type impurity region is used, the planar shape thereof becomes non-rectangular. Similarly, the gate electrodes 100G and 101G overlap with both the P-type impurity regions 83P and 84P and the gate electrodes 102G to 104G overlap with only the P-type impurity region 83P. That is, the gate widths of the gate electrodes 100G and 101G are larger than those of the gate electrodes 102G to 104G. Therefore, if a single P-type impurity region is used, the planar shape thereof becomes non-rectangular. However, in the standard cell shown in FIG. 5, each of transistors corresponding to the gate electrodes 90G to 95G is divided into two and each of transistors corresponding to the gate electrodes 100G and 101G is divided into two. Therefore, the planar shape of each of the impurity regions can be formed to be rectangular.

In a case where each of the transistors corresponding to the gate electrodes 90G to 95G is not divided into two, a source/drain region SD82 of transistors corresponding to the gate electrodes 95G and 96G cannot be shared and different source/drain regions need to be allocated thereto, respectively, to maintain a rectangular planar shape of each of the impurity regions. Similarly, in a case where each of the transistors corresponding to the gate electrodes 100G and 101G is not divided into two, a source/drain region SD83 of transistors corresponding to the gate electrodes 101G and 102G cannot be shared and different source/drain regions need to be allocated thereto, respectively, to maintain a rectangular planar shape of each of the impurity regions. In contrast thereto, in the standard cell shown in FIG. 5, the source/drain region SD82 can be shared by the transistors corresponding to the gate electrodes 95G and 96G and can be connected to a common wiring pattern 110 with a via conductor 82V. Similarly, the source/drain region SD83 can be shared by the transistors corresponding to the gate electrodes 101G and 102G and can be connected to a common wiring pattern 120 with a via conductor 83V. Accordingly, an effect of reducing the area by 10.4% is obtained.

Specifically, a transistor group that can share a source/drain region of one standard cell or functional block has a configuration characterized in that the source/drain region is shared with a common gate width (the gate width of a smaller transistor) and a differential gate width (from the gate width of a larger transistor) is separated. For example, in a case where there are two transistors that respectively have gate widths of 8 micrometers and 12 micrometers and that can share a source/drain region, the both transistors share the source/drain region with 8 micrometers being the gate width of the smaller transistor, and 4 micrometers being a differential gate width from the gate width of the larger transistor is separated, whereby two rectangular impurity diffusion regions are obtained. In the case of three or more transistors, so-called "gate division" (dividing a transistor having a gate width of 16 micrometers into two transistors having a gate width of 8 micrometers with the drain regions positioned at the center) can be considered. For example, in the case where there are three transistors respectively having gate widths of 8 micrometers, 12 micrometers, and 16 micrometers, considering that 16 micrometers=8 micrometers×2, all the transistors share source/drain regions with the gate width of 8 micrometers and 4 micrometers being a differential gate width from the gate width of 12 micrometers is similarly separated to obtain two rectangular impurity diffusion regions in the same manner as described above. The same holds true for a case where there are four or more transistors.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a semiconductor substrate;
   a first diffusion region formed on a surface of the semiconductor substrate, the first diffusion region having a rectangular shape in which a length in a first direction is a first length, the first diffusion region including first and second source/drain regions arranged in the first direction;
   a second diffusion region formed on the surface of the semiconductor substrate, the second diffusion region having a rectangular shape in which a length in the first direction is a second length greater than the first length, the second diffusion region including third, fourth and fifth source/drain regions arranged in the first direction;
   a first gate electrode extending in a second direction substantially perpendicular to the first direction, and provided between the first and second source/drain regions of the first diffusion region and between the third and fourth source/drain regions of the second diffusion region; and
   a second gate electrode extending in the second direction, and provided between the fourth and fifth source/drain regions of the second diffusion region,
   wherein the first and third source/drain regions are brought into the same potential as each other, and
   wherein the second and fourth source/drain regions are brought into the same potential as each other.

2. The apparatus of claim 1, further comprising a first wiring electrically connected between the second and fourth source/drain regions.

3. The apparatus of claim 2, further comprising a third gate electrode extending in the second direction,
   wherein the first diffusion region further includes a sixth source/drain region,
   wherein the second diffusion region further includes a seventh source/drain region,
   wherein the third gate electrode is provided between the first and sixth source/drain regions of the first diffusion region and between the third and seventh source/drain regions of the second diffusion region, and
   wherein the sixth and seventh source/drain regions are brought into the same potential as each other.

4. The apparatus of claim 3, further comprising a second wiring electrically connected between the sixth and seventh source/drain regions.

5. The apparatus of claim 4, wherein the second wiring is supplied with a power supply potential.

6. The apparatus of claim 1, wherein the first and third source/drain regions are free from a via conductor.

7. The apparatus of claim 1, wherein the first and second diffusion regions have a p-type conductivity.

8. An apparatus comprising:
   a first power supply line extending in a first direction and supplied with a first power potential;
   a second power supply line extending in the first direction and supplied with a second power potential; and.
   a plurality of standard cells arranged in the first direction between the first and second power supply lines,
   wherein each of the standard cells operates on a voltage between the first and second power potentials, wherein the plurality of standard cells include a plurality of a first standard cells having the same structure as one another, wherein each of the first standard cells includes:

a first diffusion region having a rectangular shape in which a length in the first direction is a first length, the first diffusion region including first and second source/drain regions arranged in the first direction;

a second diffusion region having a rectangular shape in which a length in the first direction is a second length greater than the first length, the second diffusion region including third, fourth and fifth source/drain regions arranged in the first direction;

a first gate electrode extending in a second direction substantially perpendicular to the first direction, and provided between the first and second source/drain regions of the first diffusion region and between the third and fourth source/drain regions of the second diffusion region; and a second gate electrode extending in the second direction, and provided between the fourth and fifth source/drain regions of the second diffusion region, wherein the first and third source/drain regions are brought into the same potential as each other, and wherein the second and fourth source/drain regions are brought into the same potential as each other.

9. The apparatus of claim 8, wherein each of the first standard cells further includes a first wiring electrically connected between the second and fourth source/drain regions.

10. The apparatus of claim 9, wherein each of the first standard cells further includes a third gate electrode extending in the second direction, wherein the first diffusion region further includes a sixth source/drain region, wherein the second diffusion region further includes a seventh source/drain region, wherein the third gate electrode is provided between the first and sixth source/drain regions of the first diffusion region and between the third and seventh source/drain regions of the second diffusion region, and wherein the sixth and seventh source/drain regions are brought into the same potential as each other.

11. The apparatus of claim 10, wherein each of the first standard cells further includes a second wiring electrically connected between the sixth and seventh source/drain regions.

12. The apparatus of claim 11, wherein the second wiring is supplied with the first power potential.

13. The apparatus of claim 8, wherein the first and third source/drain regions are free from a via conductor.

14. The apparatus of claim 8, wherein each of the first standard cells is a latch circuit or a flip-flop circuit.

* * * * *